United States Patent [19]
Gardner et al.

[11] Patent Number: 6,150,695
[45] Date of Patent: *Nov. 21, 2000

[54] MULTILEVEL TRANSISTOR FORMATION EMPLOYING A LOCAL SUBSTRATE FORMED WITHIN A SHALLOW TRENCH

[75] Inventors: Mark Gardner, Cedar Creek; Daniel Kadosh; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/741,812

[22] Filed: Oct. 30, 1996

[51] Int. Cl.⁷ .................................................. H01L 27/01
[52] U.S. Cl. ........................... 257/347; 257/510; 257/513
[58] Field of Search ............................ 257/67, 347, 350, 257/510, 513, 777; 438/404, 405

[56] References Cited

U.S. PATENT DOCUMENTS

| | | |
|---|---|---|
| 4,381,201 | 4/1983 | Sakurai . |
| 4,487,635 | 12/1984 | Kugimiya et al. ..................... 148/1.5 |
| 4,498,226 | 2/1985 | Inoue et al. . |
| 4,902,637 | 2/1990 | Kondou et al. . |
| 5,006,913 | 4/1991 | Sugahara et al. ..................... 357/41 |
| 5,407,837 | 4/1995 | Eklund . |
| 5,429,961 | 7/1995 | Woo et al. . |
| 5,470,776 | 11/1995 | Ryou . |
| 5,473,181 | 12/1995 | Schwalke et al. ..................... 257/350 |
| 5,492,851 | 2/1996 | Ryou . |
| 5,573,963 | 11/1996 | Sung . |
| 5,612,552 | 3/1997 | Owens ..................... 257/202 |
| 5,723,378 | 3/1998 | Sato . |
| 5,736,415 | 4/1998 | Chang et al. . |
| 5,808,319 | 9/1998 | Gardner et al. . |
| 5,950,082 | 9/1999 | Gardner . |

FOREIGN PATENT DOCUMENTS

358175853A 10/1983 Japan .

OTHER PUBLICATIONS

Vol. 2 S. Wolf, *Silicon Processing for the VLSI Era*, Lattice Press 1990, pp. 341–345.

*Primary Examiner*—Sara Crane
*Attorney, Agent, or Firm*—Conley, Rose & Tayon, PC; Robert C. Kowert

[57] ABSTRACT

A dual level transistor and a fabrication technique. The dual level transistor is an integrated circuit in which a first transistor is formed on an upper surface of a global dielectric and a second transistor is formed on an upper surface of a first local substrate such that the second transistor is vertically displaced from the first transistor. The first local substrate is formed within a local trench etched into a first inter-substrate dielectric. By vertically displacing the first and second transistors, the lateral separation required to isolate first and second transistors in a typical single plane process is eliminated. The integrated circuit includes a semiconductor global substrate and a first transistor formed on the global substrate. The first transistor includes a first gate dielectric formed on an upper surface of the global substrate and a first conductive gate structure formed on an upper surface of the first dielectric. The integrated circuit further includes a first inter-substrate dielectric that is formed on the first conductive gate structure and the global substrate. The first inter-substrate dielectric includes a local trench. A first local substrate is formed within the local trench. A second transistor is located within the first local substrate. The second transistor includes a second gate dielectric formed on an upper surface of the first local substrate and a second conductive gate structure formed on an upper surface of the second gate dielectric.

15 Claims, 2 Drawing Sheets

6,150,695

MULTILEVEL TRANSISTOR FORMATION EMPLOYING A LOCAL SUBSTRATE FORMED WITHIN A SHALLOW TRENCH

BACKGROUND OF THE INVENTION

1. Field of the Invention

The present invention relates to the field of semiconductor processing, and more particularly to a method for increasing transistor density in an integrated circuit through the use of protocol layering of the transistors.

2. Description of the Related Art

Integrated circuits are widely employed in a variety of electronics applications to produce complex electronics circuits on an extremely small area of a monolithic semiconductor substrate, such as silicon. Universally recognized for their low cost, high speed, low power dissipation, and high reliability, semiconductor integrated circuits long ago replaced discreet components as the predominant and preferred electronic devices. World-wide sales of integrated circuits have increased exponentially since the early 1960s. During this time, semiconductor manufacturers have strived to reduce the cost and increase the complexity of integrated circuits by fabricating a larger number of transistors in a given area of the semiconductor substrate. The primary means of achieving these goals has been reducing the size of the individual transistors that comprise the integrated circuit. Smaller transistors enable the fabrication of more complex and smaller devices. Smaller devices have the dual benefits of increasing the number of devices manufacturable on a single semiconductor wafer and increasing the probability that any individual device on a given silicon wafer will be free of random fatal defects. Since the early 1960s, when the average feature size or design rule within the industry was approximately 25 microns, the average design rule has decreased rather steadily by approximately 11% per year. The average design rule dropped below one micron in the mid 1980s, and has been decreasing steadily since then In addition to the size of the transistors themselves, the amount of area required to isolate individual transistors from one another limits the transistor density i.e., the number of transistors per unit area. Referring to FIG. 1, a conventional integrated circuit is shown in which a first transistor 10 and a second transistor 12 are fabricated on a semiconductor substrate 8. To isolate first transistor 10 from second transistor 12, an isolation structure such as shallow trench isolation structure 14 is required to prevent the inadvertent coupling of source/drain regions 16 of first transistor 10 and source/drain region 18 of second transistor 12. The lateral dimension $d_L$ of an isolation structure such as shallow trench isolation structure 14 limits the density of transistors that can be fabricated over a given area of substrate 8. As a rule of thumb, the minimum lateral dimension $d_L$ necessary to adequately ensure proper isolation between source/drain region 16 of first transistor 10 and source/drain region 18 of second transistor 12 is approximately equal to the lateral dimension $L_t$ of first transistor 10. Shallow trench isolation structure 14 occupies a region of substrate 8 that could otherwise be devoted to the formation of active transistors and represents a limitation on the achievable transistor density. It would, therefore, be highly desirable to implement a circuit design and fabrication technique to reduce or eliminate the percentage of substrate 8 occupied by isolation regions 14.

SUMMARY OF THE INVENTION

The problems identified above are in large part addressed by a multi-level transistor and a fabrication technique for making the transistor. The multi-level transistor is an integrated circuit in which a first transistor is formed on an upper surface of a global substrate and a second transistor is formed on an upper surface of a first local substrate such that the second transistor is vertically displaced from the first transistor. The first local substrate is formed within a local trench etched into the first inter-substrate dielectric. By vertically displacing the first and second transistors, the lateral separation required to isolate the first and second transistors is substantially reduced or eliminated. This circuit and process can be extended to encompass more than two levels of transistors wherein each subsequent transistor is formed upon a subsequent inter-substrate dielectric/local substrate pair.

Broadly speaking, the present invention contemplates an integrated circuit. The integrated circuit includes a global substrate comprised of a semiconductor material. In a preferred embodiment, the global substrate includes a p+ silicon bulk upon which a p– epitaxial layer has been formed. The epitaxial layer, in a preferred embodiment, has a resistivity of approximately 10 to 15 Ω-cm. The integrated circuit further includes a first transistor. The first transistor has a first gate dielectric formed on an upper surface of the global substrate and a first conductive gate structure formed on an upper surface of the first gate dielectric. The integrated circuit still further includes a first inter-substrate dielectric formed on the first conductive gate structure and the global substrate. The first inter-substrate dielectric includes a first local trench extending downward from an upper surface of the first inter-substrate dielectric. A first local trench includes a first trench sidewall, a second trench sidewall, and a trench floor extending laterally between the first trench sidewall and the second trench sidewall. A first local substrate, comprised of a semiconductor material, is formed within the first local trench. In a presently preferred embodiment, the first local substrate comprises polycrystalline silicon. A second transistor is formed within the first local substrate. The second transistor includes a second gate dielectric formed on an upper surface of the first local substrate and a second conductive gate structure formed on an upper surface of the second gate dielectric. The second transistor is, therefore, vertically displaced from the first transistor. Preferably, the first local substrate is approximately one to eight microns in thickness. In a presently preferred embodiment in which the first local substrate is a polycrystalline silicon, a preferred thickness of the first local substrate is approximately one to eight microns. The polycrystalline silicon still more preferably has a grain size that is approximately greater than or equal to a channel length of the second transistor. In the presently preferred embodiment, the second substrate insulator is comprised of oxide or a silicon nitride.

The present invention still further contemplates a semiconductor process for fabricating an integrated circuit. A global substrate is provided. In a presently preferred embodiment, the global substrate includes a p– single crystal silicon upper region, such as an epitaxial layer, formed over a p+ silicon bulk. A resistivity of the p– single crystal silicon upper region is approximately 10 to 15 Ω-cm. A first transistor is formed within an active region of the global substrate. The first transistor includes a first gate dielectric formed on an upper surface of the global substrate and a first conductive gate structure formed on an upper surface of the first gate dielectric. In a preferred embodiment, the formation of the first transistor includes thermally growing an oxide film on an upper surface of the global substrate to form the first gate dielectric layer, depositing polysilicon on the first gate dielectric layer, heavily doping the polysilicon, and patterning the polysilicon to form the first conductive gate structure. Thereafter, a source/drain impurity distribution is ion implanted into a first pair of source/drain regions within an upper region of the global substrate laterally displaced on either side of the conductive gate structure. In one embodiment, the formation of the first transistor further includes ion implanting a first p-well impurity distribution, a first p-type punchthrough impurity distribution, and a first n-channel $v_t$ adjust impurity distribution into an n-channel region of the global substrate.

After the formation of the first transistor, the semiconductor process further includes forming a first inter-substrate dielectric layer on the first conductive gate structure and the global substrate. In a presently preferred embodiment, the process of forming the first inter-substrate dielectric includes depositing oxide or silicon nitride. A local trench is then formed in the first inter-substrate dielectric, preferably through the use of a fluorocarbon containing plasma etch process. Preferably a first sidewall of the first local trench is approximately aligned with a boundary of the first transistor. Thereafter, a first local substrate is formed within the first local trench. The first local substrate is a semiconductor. In one presently preferred embodiment, the formation of the first local substrate includes chemically vapor depositing a blanket layer of a silicon bearing film at a pressure of less than approximately 2.0 torrs. Still further preferably, the silicon bearing film is deposited at a temperature of less than approximately 580° C. whereby the first local substrate comprises amorphous silicon. The amorphous silicon is then annealed at a temperature of approximately 400–800° C. for a duration of approximately 2 to 24 hours to form polycrystalline silicon. Thereafter, portions of the silicon bearing film exterior to the first local trench are removed with a planarization process to form the first local substrate.

The semiconductor process further includes a step of forming a second transistor within an active region of the first local substrate. The second transistor includes a second gate dielectric formed on an upper surface of the first local substrate and a second conductive gate structure formed on an upper surface of the second gate dielectric such that the second transistor is vertically displaced from the first transistor. Preferably, the formation of the second transistor includes thermally growing an oxide film on an upper surface of the first local substrate to form the second gate dielectric, depositing polysilicon on the second gate dielectric, heavily doping the polysilicon, and patterning the polysilicon to form the second conductive gate structure. Thereafter, a source/drain impurity distribution is ion implanted into a second pair of source/drain regions within an upper region of the first local substrate regions are laterally displaced on either side of the second conductive gate structure. In one embodiment, the formation of the second transistor further includes ion implanting a second p-well impurity distribution, a second p-type punchthrough impurity distribution, and a second n-channel $v_t$ adjust impurity distribution into an n-channel region of the global substrate. In the preferred process, the second transistor is laterally displaced from the first transistor by a lateral distance approximately less than or equal to a channel length of the second transistor.

The present invention still further contemplates an integrated circuit comprised of a global substrate, a first transistor, wherein the first transistor includes a first gate dielectric formed on an upper surface of the global substrate and a first conductive gate structure formed on an upper surface of the first dielectric, and at least one subsequent transistor level. Each subsequent transistor level includes an inter-substrate dielectric formed on a topography defined by a preceding transistor level and including a local trench, a local substrate formed within the local trench of the inter-substrate dielectric, and a transistor. Each subsequent transistor includes a gate dielectric formed on an upper surface of the local substrate and a gate conductive structure formed on an upper surface of the gate dielectric. Each subsequent transistor is vertically displaced from a transistor on the preceding transistor level. In a presently preferred embodiment, a lateral displacement between a transistor of the subsequent transistor level and a transistor of the preceding transistor level is less than a channel length of the subsequent level transistor.

BRIEF DESCRIPTION OF THE DRAWINGS

Other objects and advantages of the invention will become apparent upon reading the following detailed description and upon reference to the accompanying drawings in which.

Figure 1:
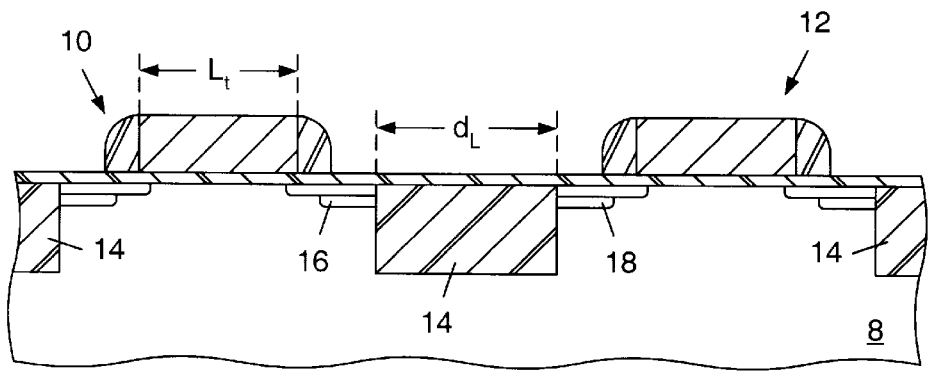
FIG. 1 is a partial cross-sectional view of an integrated circuit in which a first transistor and a second transistor are laterally displaced by an isolation structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 7:
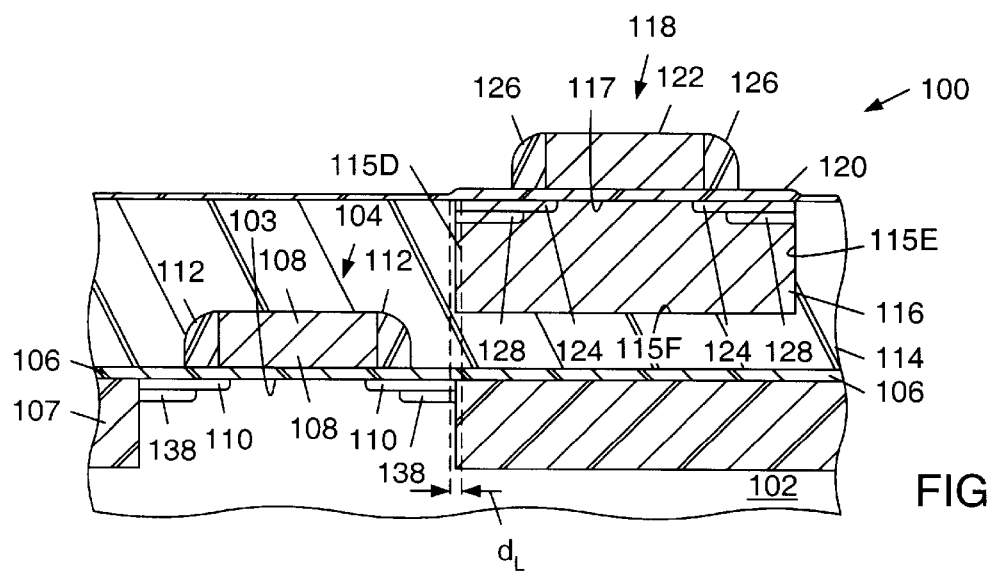
FIG. 7 is a processing step subsequent to FIG. 6 in which a second transistor has been formed on the first local substrate.

Turning now to the drawings, FIG. 7 shows an integrated circuit 100 according to the present invention. Integrated circuit 100 includes a global substrate 102. Global substrate 102 is a semiconductor material. In a presently preferred embodiment, global substrate 102 is comprised of a p+ silicon bulk (not shown in the drawing) and a p− epitaxial layer extending from the p+ bulk to upper surface 103 of global substrate 102. Preferably, a resistivity of the p− epitaxial layer is approximately 10 to 15 Ω-cm. Integrated circuit 100 further includes first transistor 104. First transistor 104 includes a first gate dielectric layer 106 formed on upper surface 103 of global substrate 102 and a first conductive gate structure 108, which is formed on an upper surface of first gate dielectric 106. In the embodiment shown in FIG. 2, first transistor 104 further includes lightly doped source/drain regions 110, heavily doped source/drain regions 138, and spacer structures 112. First gate dielectric layer 106 preferably comprises a thermal oxide having a thickness of approximately 20 to 200 angstroms. In the presently preferred embodiment, first conductive gate structure 108 includes chemically vapor deposited polysilicon that has been doped to produce a sheet resistivity less than approximately 500 Ω/sq.

A channel region 105 located in global substrate 102 below first conductive gate structure 108 may comprise one or more impurity distributions such as a well impurity distribution, a punchthrough impurity distribution, or a $v_t$ adjust impurity distribution, all as are well known in the field of semiconductor fabrication. It will be appreciated that, although only one first transistor 104 is shown formed within global substrate 102, the present invention contemplates a global substrate in which a plurality of such first transistors 104 are formed. To isolate each first transistor 104 formed within global substrate 102, isolation structures such as shallow trench isolation structure 107 are formed in global substrate 102. It is further contemplated, in a CMOS embodiment of the present invention, that one or more of the plurality of first transistors 104 may be of the n-channel variety while one or more other such transistors 104 can be of a p-channel type. In such a CMOS embodiment, appropriate masking steps may be required to produce separate source/drain impurity distributions as well as separate well, punchthrough, and $v_t$ adjust impurity distributions within global substrate 102. Spacer structures 112 are included in an embodiment of the present invention in which lightly doped drain (LDD) structures are desirable. Lightly doped drain processes, well known in the field, include a two implant, source/drain formation process designed to reduce the maximum E-field that occurs when the drain-to-substrate junction is heavily reversed biased. Reduction of the maximum E-field reduces the occurrence of undesirable hot electron injection into channel region 105 and possibly through first gate dielectric 106 to first conductive gate structure 108.

Integrated circuit 100 further includes first inter-substrate dielectric 114. First inter-substrate dielectric 114 is formed over the topography defined by first conductive gate structure 108 upon global substrate 102. As shown in the drawing, the topography upon which inter-substrate dielectric 114 is formed may include spacer structures 112 and possibly a first gate dielectric 106 as well. First inter-substrate dielectric 114 electrically insulates first conductive gate structure 108 of first transistor 104 from subsequently formed structures as well as providing a physical base upon which subsequent structures may be fabricated. In one preferred embodiment, first inter-substrate dielectric 114 comprises an oxide material such as a chemically vapor deposited oxide formed from a silane or TEOS source. In an alternative embodiment, first inter-substrate dielectric 114 may comprise a silicon nitride layer or possibly a combined layer of silicon nitride and oxide. In a preferred embodiment, first inter-substrate dielectric 114 has a thickness of approximately one to ten microns. First inter-substrate dielectric 114 isolates first transistor 104 from structures formed on first inter-substrate dielectric 114. By vertically displacing the subsequently formed structures, integrated circuit 100 can tolerate a significant reduction or possibly an elimination of the lateral isolation typically required in conventional single level transistors. First inter-substrate 114 further includes first local trench 115 defined by first sidewall 115W, second trench sidewall 115E, and trench floor 115F.

Integrated circuit 100 further includes first local substrate 116 formed within first local trench 115 of first inter-substrate dielectric 114. First local substrate 114 preferably comprises polycrystalline silicon. As discussed in greater detail below, a grain size of the polycrystalline silicon within the preferred embodiment of first local substrate 116 is at least as large as the channel length of second transistor 118. Larger grain size polysilicon is preferred because of its lower resistivity and its higher occurrence of free charge. Smaller grain size polysilicon films become fully depleted more easily than larger grains possibly resulting in a dramatic increase in resitivity. Because first local substrate 116 will serve as the silicon substrate for one or more subsequently formed transistors 118, it is desirable that the polysilicon within first local substrate 116 approximate the electrical properties of single crystal silicon to the greatest extent possible.

Second transistor 118 includes a second gate dielectric 120, preferably a thermally formed oxide film of approximately 20 to 200 angstroms in thickness, and a second conductive gate structure 122 formed on an upper surface of second gate dielectric 120. Like its counterpart in first transistor 104, second conductive gate structure 122 is preferably comprised of heavily doped CVD polysilicon. Second transistor 118 further includes source/drain impurities laterally spaced on either side of second conductive gate structure 122 within an upper region of first local substrate 116. In the embodiment shown in FIG. 7, the second transistor source/drain impurities include lightly doped source/drain regions 124 and heavily doped source/drain regions 128. In conjunction with the formation of lightly doped impurity distributions 124, second transistor 118 includes spacer structures 126 formed on side-walls of second conductive structure 122. As shown in greater detail in FIG. 6, first local substrate 116 may include various impurity distributions including a second well impurity distribution 132, a second punchthrough impurity distribution 134, and a second $v_t$ adjust impurity distribution 136. It is to be understood that second transistor 118 is but one of a plurality of transistors formed on or within first local substrate 116. Additional transistors (not shown in the drawing) can be easily incorporated into first local substrate 116 as will be appreciated by those skilled in the art of semiconductor processing. Moreover, it will be appreciated that one or more of the second transistors 118 formed within or upon first local substrate 116 may be of the n-channel variety, while one or more other of the second transistors 118 may comprise transistors of the p-channel type. It will be further appreciated that appropriate masking steps and implant steps are required in embodiments in which it is desired to form both n-channel and p-channel second transistors 118 upon first local substrate 116. Second transistor 118 is vertically displaced from first transistor 110. Source/drain region 138 of first transistor 104 is effectively isolated from source/drain region 128 and local substrate 116 of second transistor 118 by first inter-substrate dielectric layer 114. Because the isolation of the first and second source/drain regions is effectively vertical, the lateral displacement $d_L$ between source/drain region 138 of first transistor 104 and source/drain region 128 of second transistor 118 can be dramatically reduced or possibly eliminated. The reduction or elimination of lateral displacement $d_L$ between first transistor 104 and second transistor 118 permits the formation of higher density integrated circuits than is possible with a conventional single plane, transistor fabrication process. In the presently preferred embodiment, a thickness or depth of first local substrate 116 is approximately one to eight microns.

It will be appreciated that the present invention may be easily extended to encompass more than two levels of transistors. More specifically, integrated circuit 100 may include subsequent transistor levels such that integrated circuit 100 comprises three or more transistor levels. Each transistor level formed subsequently to the formation of first transistor 108 will include an inter-substrate dielectric (similar to first inter-substrate dielectric 114) formed on a topography defined by a preceding transistor level wherein each inter-substrate dielectric includes a local trench (similar to first local trench 115), a local dielectric (similar to local dielectric 116) formed within the local trench of the inter-substrate dielectric, and a transistor (similar to second transistor 118). The transistor includes a gate dielectric formed on an upper surface of the local substrate and a gate conductor structure formed on an upper surface of the gate dielectric. Accordingly, the transistor is vertically displaced from a transistor on the preceding transistor level. In this manner, one or more subsequent transistor levels may be included within integrated circuit 100.

Figure 2:
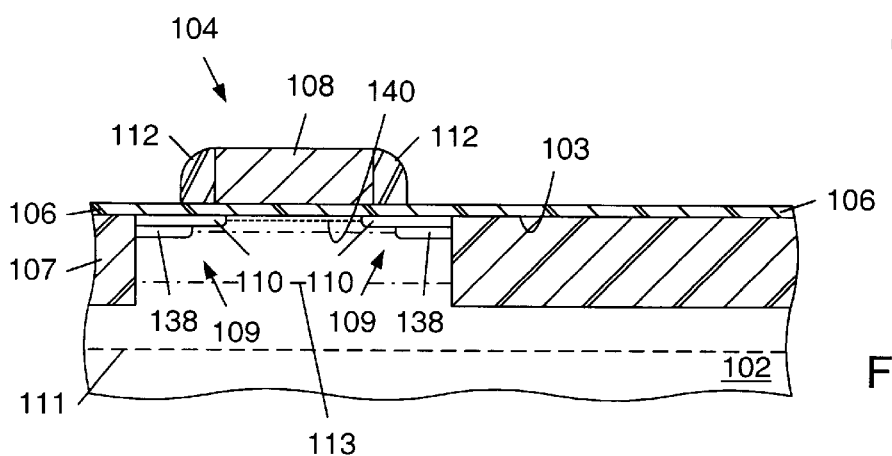
FIG. 2 is a partial cross-sectional view of a first transistor formed on a global substrate.

Turning now to FIGS. 2–7, the processing sequence for forming integrated circuit 100 in accordance with the present invention is disclosed. FIG. 2 shows first transistor 104 formed within global substrate 102. In one embodiment, global substrate 102 is doped with one or more substrate impurity distributions. For example, a first well distribution 111 may be introduced into global substrate 102 in an embodiment in which it is desirable to produce both p-channel and n-channel devices in global substrate 102. In such an embodiment, a well impurity distribution of the opposite conductivity type of well impurity distribution 111 will be introduced into those regions of global substrate 102 in which it is desired to produce first transistors 104 of the opposite channel type. Similarly, a first punchthrough impurity distribution 113 is shown in FIG. 2. A punchthrough impurity distribution can be incorporated into first transistor 104 to reduce sub-threshold currents due to punchthrough effects See, 2 S. Wolf, *Silicon Processing for the VLSI Era*, Lattice Press 1990. FIG. 2 further discloses a first $v_t$ adjust impurity distribution 115 introduced into global substrate 102 in a shallow (i.e., less than 0.2 microns) region below upper surface 103 of global substrate 102. Threshold voltage adjust impurity distributions such as first $v_t$ adjust impurity distribution 140 are well known in the field to precisely control transistor threshold voltages. Each of the impurity distributions within global substrate 102 is preferably introduced into global substrate 102 with an ion implantation step (not shown in the drawing). In a n-channel embodiment of first transistor 104, first well impurity distribution 111 is a p-type impurity type distribution preferably produced by the ion implantation of boron. The first punchthrough impurity distribution 113, in an n-channel embodiment of first transistor 104 is also of a p-type, such as is formed from a boron ion implantation. Finally, the first $v_t$ adjust impurity distribution 140 is typically designed to increase the absolute value of the threshold voltage for the n-channel embodiments and is, therefore, also of a p-type impurity such as boron. In a p-channel embodiment of first transistor 104, first well impurity distribution 111 is an n-type impurity such as phosphorous, or arsenic, the first punchthrough impurity distribution 113 is of an n-type impurity such as phosphorous or arsenic, while the $v_t$ adjust impurity distribution 140 may differ depending upon the conductivity type of the impurity used to dope first conductive gate structure 108. In an embodiment in which a p-type impurity such as boron is used to dope conductive gate structures 108 of the p-channel transistors 104, first $v_t$ adjust impurity distribution 140 preferably comprises boron.

After the various impurity distributions have been introduced into global substrate 102, a first gate dielectric 106 is formed on upper surface 103 of global substrate 102. First gate dielectric 106 is preferably formed through the thermal oxidation of global substrate 102 such as is well known in the field. In the preferred embodiment, a thickness of first gate dielectric 106 is between approximately 20 and 200 angstroms. Subsequent to the formation of first gate dielectric 106, first conductive gate structure 108 is formed. The formation of first conductive gate structure 108 is preferably accomplished by chemically vapor depositing polysilicon at low pressure (i.e. less than approximately 2.0 torrs). After the deposition of the polysilicon layer, the polysilicon film is typically doped, preferably through another ion implantation step, to produce a heavily doped polysilicon film. For purposes of this disclosure, heavily doped polysilicon is defined as polysilicon having a sheet resistivity of less than approximately 500 $\Omega$/sq. The polysilicon film is then patterned according to well known photolithography and etch processing steps. Thereafter, the source/drain impurity distributions are introduced into global substrate 102. In the embodiment shown in FIG. 2 in which both lightly doped source/drain regions 110 and heavily doped source/drain regions 138 are present, the source/drain formation process includes the steps of implanting lightly doped source/drain impurity distribution 110 into global substrate 102 (during which process first conductive gate structure 108 serves as the implant mask such that lightly doped source/drain impurity distributions 110 are self-aligned with first conductive gate structure 108). Thereafter, spacer structures 112 are formed on side-walls of first conductive gate structure 108. The formation of spacer structures such as spacer structures 112 is accomplished by depositing a conformal dielectric film, typically a CVD TEOS oxide, and thereafter performing an anisotropic etch to remove portions of the conformal film from the planar or horizontal regions of the topography. After the formation of the spacer structures 112, heavily doped source/drain impurity distribution 138 is implanted into global substrate 102. Ideally, the implant energy and dose used to introduce lightly doped source/drain impurity distributions into global substrate 102 are less than the energy and dose used to introduce heavily doped source/drain impurity distributions 138 into global substrate 102. To electrically isolate first transistor 104 from other first transistors 104 (not shown in the drawings) formed on or within global substrate 102, isolation structures such as shallow trench isolation structure 107 are fabricated in conjunction with the formation of first transistor 104. Shallow trench isolation structures 107 may be optionally formed within global substrate 102 prior to the transistor formation process just described or, alternatively, after transistor formation. In either embodiment, the isolation formation process includes the steps of etching an isolation trench into global substrate 102, filling the trench with a dielectric material such as a CVD oxide, and removing the excess trench dielectric from regions exterior to the isolation trench with a planarization process such as chemical mechanical polish. It will be appreciated to those skilled in the art that alternative isolation structures exist and may be suitably incorporated in lieu of shallow trench isolation structure 107. For example, LOCOS isolation structures may be used to isolate individual first transistors 104 within global substrate 102. The formation of LOCOS isolation structures is accomplished by selectively oxidizing portions of global substrate 102, preferably through the use of a silicon nitride mask. After the selected portions of global substrate 102 have been thermally oxidized, the silicon nitride mask can be removed leaving behind the isolation structures.

Figure 3:
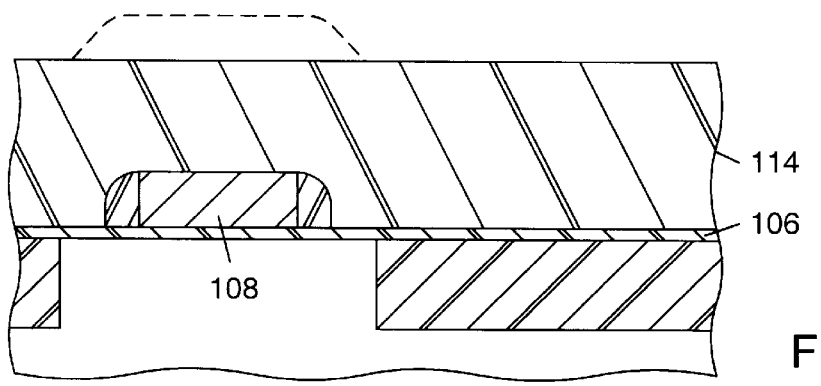
FIG. 3 is a processing step subsequent to FIG. 2, in which a first inter-substrate dielectric has been formed on a first conductive gate structure of the first transistor and the global substrate.
Figure 4:
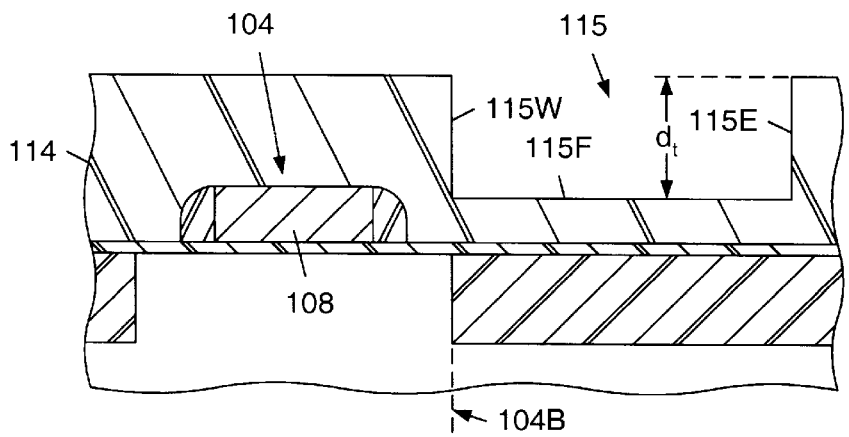
FIG. 4 is a processing step subsequent to FIG. 3 in which a first local trench has been formed in the first inter-substrate dielectric.

Turning to FIG. 3, a first inter-substrate dielectric layer 114 is formed upon first transistor 104 and global substrate 102. The formation of first inter-substrate dielectric 114 is preferably accomplished by blanket depositing an oxide layer over a topography defined by first transistor 104 and global substrate 102. The blanket deposition of the first inter-substrate dielectric 114 is preferably performed with a chemical vapor deposition process. After the deposition of first inter-substrate dielectric 114, a planarization step such as a chemical mechanical polish is preferably performed to eliminate peaks (shown in phantom in the figure) from first inter-substrate dielectric 114 such that an upper surface of first inter-substrate dielectric 114 is substantially planar. Turning to FIG. 4, first local trench 115 is formed in first inter-substrate dielectric 114. First local trench 115 extends downward from an upper surface of first inter-substrate dielectric 114 and includes first trench sidewall 115W, second trench sidewall 115E, and trench floor 115F. In a preferred embodiment, a depth $d_t$ of first local trench 115 is in the range of approximately 0.1 to 8.0 microns. The formation of first local trench 115 is accomplished in a preferred embodiment with an anisotropic etch process. In one embodiment, the anisotropic etch is achieved with a fluorocarbon bearing plasma. A representative fluorocarbon suitable for use in this process is $CF_4$. In one embodiment, first trench sidewall 115W is approximately aligned, in a lateral direction, with a boundary of first transistor 104, represented in FIG. 4 as reference numeral 104B.

Figure 5:
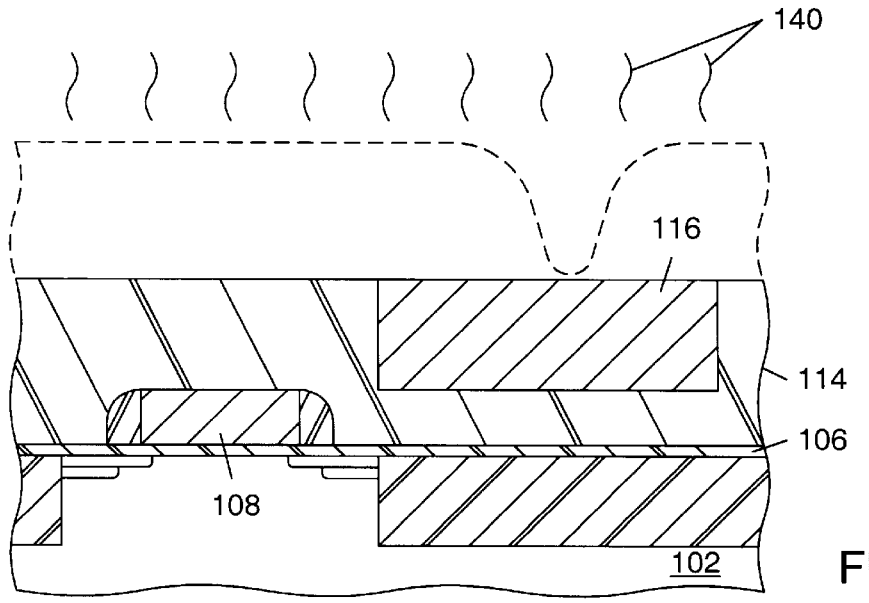
FIG. 5 is a processing step subsequent to FIG. 4 in which a first local substrate has been formed within the first local trench and subjected to an anneal cycle.

In FIG. 5, first local substrate 116 is formed within first local trench 115 of first inter-substrate dielectric 114. In a presently preferred embodiment, first local substrate 116 comprises large grain size polysilicon. As discussed previously, it is desirable to produce a polysilicon film in which the grain size is as large as possible such that the electrical characteristics of first local substrate 116 approximate the electrical characteristics of a single crystal silicon film. To accomplish this goal, the preferred method of forming first local substrate 116 includes the steps of depositing a silicon bearing film upon the topography cooperatively defined by first inter-substrate dielectric 114 and first local trench 115 at a temperature less than approximately 580° C. at low pressure (i.e. less than approximately 2.0 torrs) in a chemical vapor deposition reactor such that the deposited first local substrate 116 film comprises amorphous silicon. The amorphous silicon film is then subjected to a high temperature step (shown as reference numeral 140 in the drawing) such as a thermal anneal cycle at a temperature of approximately 400 to 1000° C. for a duration of approximately 2 to 24 hours. The recrystalization of an amorphous silicon film during the high temperature step results in the formation of a polysilicon film in which the average grain size is larger than the average grain size in polysilicon films deposited at an initial temperature of approximately 580° C. or greater. It is theorized that, by combining the deposition of an amorphous silicon film with a thermal anneal cycle, an average grain size of first local substrate 116 can approach 0.3 microns and greater. For sub-micron transistor applications, a grain size in this region may be sufficiently large such that the silicon bearing film approximates the electrical characteristics of a single crystal silicon film. First local substrate 116 is then fashioned by removing the portions of the silicon bearing film exterior to first local trench 115, preferably through the use of a planarization process such as a chemical mechanical polish, possibly in combination with conventional mask and etch steps.

Figure 6:
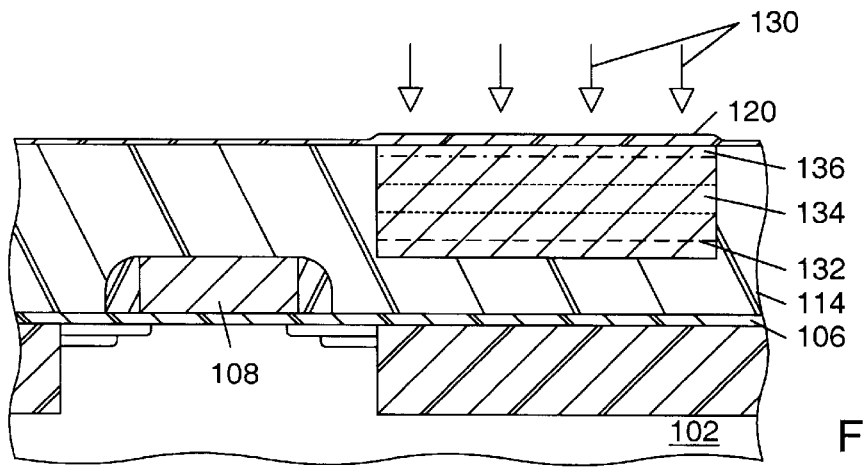
FIG. 6 is a processing step subsequent to FIG. 5 in which a second gate dielectric layer has been formed on an upper surface of the first local substrate and a well impurity distribution, a punchthrough impurity distribution, and a threshold $v_t$ adjust impurity distribution have been introduced into the first local substrate.

In FIG. 6, second gate dielectric layer 120 is formed on an upper surface of first local substrate 116. Similar in structure to first gate dielectric 106, second gate dielectric 120 is a thermal oxide film of approximately 20 to 200 angstroms in thickness. Thereafter, various impurity distributions analogous to the various impurity distributions introduced into global substrate 102 as discussed previously with respect to FIG. 2 are introduced into first local substrate 116. The introduction of the various impurity distributions into first local substrate 116 is preferably accomplished with ion implantation steps collectively represented in the figure as reference numeral 130. In the embodiment shown in FIG. 6, the various impurity distributions introduced into first local substrate 116 include a second well impurity distribution 132, a second punchthrough distribution 134, and a second $v_t$ adjust impurity distribution 136. As will be appreciated to those skilled in the art of semiconductor processing, each impurity distribution shown in FIG. 6 may be further divided into a p-channel impurity distribution and an n-channel impurity distribution in an embodiment in which it is desired to fabricate transistors of both conductivity types within first local substrate 116. In such an embodiment, the various impurity distributions are introduced into selected regions of first local substrate 116 through the use of conventional masking steps.

Turning now to FIG. 7, a second transistor 118 is formed on first local substrate 116. Second conductive gate structure 122 is formed on an upper surface of second gate dielectric 120. Preferably, second conductive gate structure 122 is formed of polysilicon that is chemically vapor deposited on second gate dielectric 120 at low pressure (i.e. less than approximately 2.0 torrs). Preferably, second conductive gate structure 122 has a sheet resistivity of less than approximately 500 Ω/sq. To achieve such a sheet resistivity in an embodiment in which second conductive gate structure 122 is polysilicon, impurities are introduced into second conductive gate structure 122 through an ion implantation step (not shown). In a CMOS embodiment, two separate ion implantation steps may be used—a first ion implantation introducing p-type impurities such as boron into those second conductive gate structures 122 that will form the gates for p-channel transistors, and a second implantation used to introduce n-type impurities such as phosphorous or arsenic into n-channel second conductive gate structures 122. The formation of second conductive gate structure 122 is achieved by patterning a blanket layer of a conductive material through the use of well known photolithography and masking steps.

The fabrication of second transistor 118 is completed by introducing impurities into the source/drain regions of first local substrate 116. In the embodiment shown in FIG. 7, a lightly doped impurity distribution 124 is introduced into first local substrate 116, preferably with an ion implantation step. Second conductive gate structure serves as a self aligning mask during the formation of lightly doped source/drain impurity distributions 124. Thereafter, spacer structures 126 are formed on side walls of second conductive gate structure 122 and heavily doped source/drain distributions 128 are introduced into first local substrate 116, preferably with another implantation step.

It will be appreciated to those skilled in the art having the benefit of this disclosure that this invention is capable of substantially reducing or eliminating laterally formed isolation structures between a first transistor formed within a global substrate and a vertically displaced second transistor formed in a first local substrate. Moreover, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An integrated circuit, comprising:
   a global substrate, wherein said global substrate comprises a semiconductor;
   a first transistor, wherein said first transistor comprises a first gate dielectric formed on an upper surface of said global substrate and a first conductive gate structure formed on an upper surface of said first gate dielectric;
   a first inter-substrate dielectric formed on said first conductive gate structure and said global substrate, wherein said first inter-substrate dielectric is a single layer of dielectric material, said first inter-substrate dielectric having formed therein a local trench extending downward from an upper surface of said first inter-substrate dielectric;
   a first local substrate formed within said local trench, wherein said first local substrate comprises a semiconductor material; and
   a second transistor, wherein said second transistor includes a second gate dielectric formed on an upper surface of said first local substrate and a second conductive gate structure formed on an upper surface of said second gate dielectric such that said second transistor is vertically displaced from said first transistor.

2. The integrated circuit as recited in claim 1, wherein a lateral displacement from the edge of said first transistor to the edge of said second transistor is less than a channel length of said second transistor.

3. The integrated circuit as recited in claim 1, wherein said global substrate further comprises single crystal silicon.

4. The integrated circuit as recited in claim 1, wherein said first local substrate comprises polycrystalline silicon.

5. The integrated circuit as recited in claim 4, wherein a thickness of said first local substrate is approximately 1 to 8 microns.

6. The circuit as recited in claim 4, wherein a grain size of said polycrystalline silicon is approximately greater than or equal to a channel length of said second transistor.

7. The circuit as recited in claim 1, wherein said inter-substrate dielectric comprises a material selected from the group consisting of oxide and silicon nitride.

8. An integrated circuit comprising:
   a global substrate, wherein said global substrate comprises a semiconductor;
   an isolation structure formed within said global substrate;
   a first transistor having a boundary at said isolation structure, wherein said first transistor comprises a first gate dielectric formed on an upper surface of said global substrate and a first conductive gate structure formed on an upper surface of said first gate dielectric;
   a first inter-substrate dielectric formed on said first conductive gate structure and said global substrate, said first inter-substrate dielectric having formed therein a local trench extending downward from an upper surface of said first inter-substrate dielectric, wherein said local trench extends over said isolation structure, and wherein a sidewall of said local trench is approximately aligned with said boundary;
   a first local substrate formed within said local trench, wherein said first local substrate comprises a semiconductor material; and
   a second transistor, wherein said second transistor includes a second gate dielectric formed on an upper surface of said first local substrate and a second conductive gate structure on an upper surface of said second gate dielectric such that said second transistor is vertically displaced from said first transistor and wherein said second transistor is vertically spaced over said isolation structure.

9. The integrated circuit as recited in claim 8, wherein said isolation structure comprises a shallow trench isolation structure.

10. The integrated circuit as recited in claim 8, wherein a lateral displacement from the edge of said first transistor to the edge of said second transistor is less than a channel length of said second transistor.

11. The integrated circuit as recited in claim 8, wherein said global substrate further comprises single crystal silicon.

12. The integrated circuit as recited in claim 8, wherein said first local substrate comprises polycrystalline silicon.

13. The integrated circuit as recited in claim 12, wherein a thickness of said first local substrate is approximately 1 to 8 microns.

14. The circuit as recited in claim 13, wherein a grain size of said polycrystalline silicon is approximately greater than or equal to a channel length of said second transistor.

15. The circuit as recited in claim 8, wherein said inter-substrate dielectric comprises a material selected from the group consisting of oxide and silicon nitride.

* * * * *